(12) United States Patent
Chu et al.

(10) Patent No.: US 6,784,466 B2
(45) Date of Patent: Aug. 31, 2004

(54) SI/SIGE OPTOELECTRONIC INTEGRATED CIRCUITS

(75) Inventors: Jack Oon Chu, Astoria, NY (US); Khalid EzzEldin Ismail, Yorktown Heights, NY (US); Steven John Koester, Croton-on-Hudson, NY (US); Bernd-Ulrich H. Klepser, Munich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/120,254

(22) Filed: Apr. 11, 2002

(65) Prior Publication Data

US 2002/0171077 A1 Nov. 21, 2002

Related U.S. Application Data

(63) Continuation of application No. 09/099,978, filed on Jun. 19, 1998, now abandoned.
(60) Provisional application No. 60/076,462, filed on Mar. 2, 1998.

(51) Int. Cl.[7] .......................................... H01L 31/0328
(52) U.S. Cl. ...................................... 257/194; 257/431

(58) Field of Search .......................................... 257/194

(56) References Cited

U.S. PATENT DOCUMENTS

| 5,682,455 | A | * | 10/1997 | Kovacic et al. | ............. 385/131 |
| 6,114,994 | A | * | 9/2000 | Soref et al. | ................. 342/372 |
| 6,207,977 | B1 | * | 3/2001 | Augusto | ..................... 257/192 |

* cited by examiner

*Primary Examiner*—Douglas Wille
(74) *Attorney, Agent, or Firm*—Scully, Scott, Murphy & Presser; Robert M. Trepp, Esq.

(57) ABSTRACT

An integrated optoelectronic circuit and process for making is described incorporating a photodetector and a MODFET on a chip. The chip contains a single-crystal semiconductor substrate, a buffer layer of SiGe graded in composition, a relaxed SiGe layer, a quantum well layer, an undoped SiGe spacer layer and a doped SiGe supply layer. The photodetector may be a metal-semiconductor-metal (MSM) or a p-i-n device. The detector may be integrated with an n- or p-type MODFET, or both in a CMOS configuration, and the MODFET can incorporate a Schottky or insulating gate. The invention overcomes the problem of producing Si-manufacturing-compatible monolithic high-speed optoelectronic circuits for 850 nm operation by using epixially-grown Si/SiGe heterostructure layers.

34 Claims, 13 Drawing Sheets

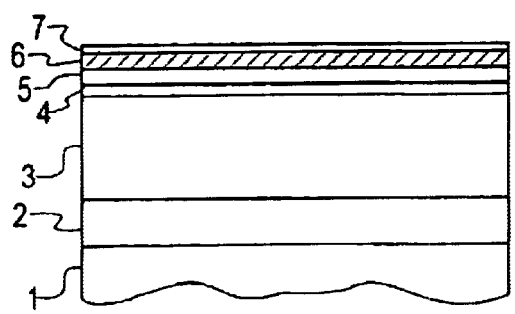
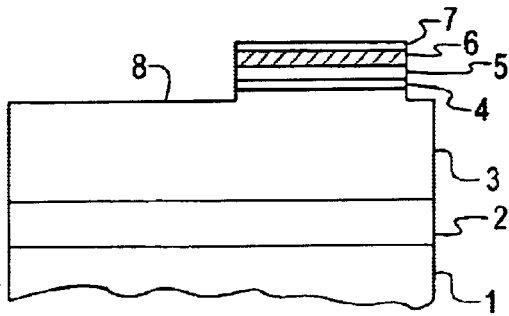
Fig. 1A        Fig. 1B
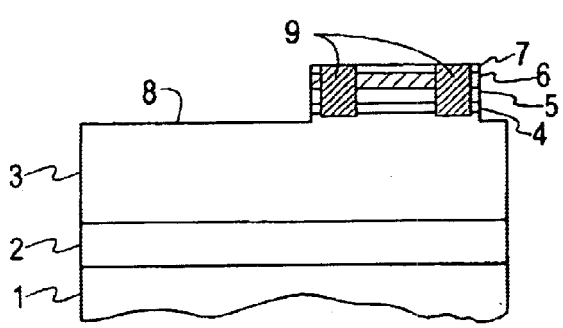
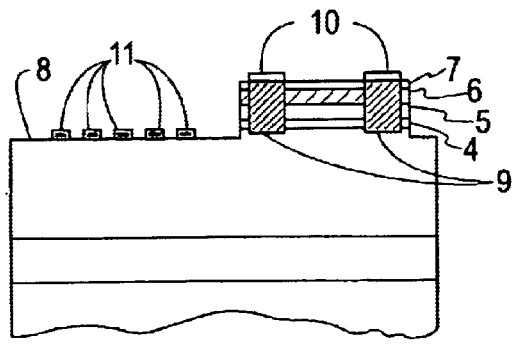
Fig. 1C        Fig. 1D
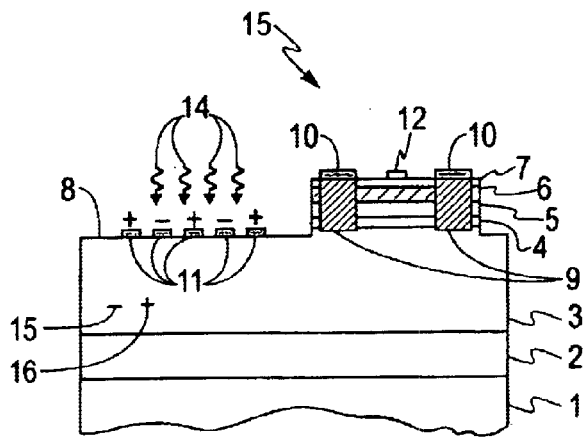
Fig. 1E

SI/SIGE OPTOELECTRONIC INTEGRATED CIRCUITS

CROSS REFERENCED TO RELATED APPLICATION

This is a continuation of application Ser. No. 09/099,978, filed Jun. 19, 1998 now abandoned.

The present application claims priority to co-pending U.S. provisional application Ser. No. 60/076,462 filed Mar. 2, 1998.

BACKGROUND OF THE INVENTION

1. Field of the Invention

This invention relates to semiconductors and more particularly to integrated optoelectronic receiver devices and circuits incorporating photodetectors and MODFETs formed with SiGe layers.

2. Description of the Prior Art

The advent of fiber-optic communications technology has increased the demand for high-speed optoelectronic devices and circuits that operate with data rates of greater than 1 Gbit/sec. In particular, a growing market exists for local area networks and short-haul optical connections that operate at wavelengths of λ=850 nm. It would be desirable to fabricate these circuits monolithically due to the lower cost of production and performance advantages over discrete components. It would also be desirable to fabricate such circuits entirely in a silicon-based technology due to the reduced cost arising from their compatibility with existing Si-based technologies including CMOS logic circuits.

In the prior art, GaAs has been the previous choice for monolithically integrated optical receivers operating at λ=850 nm. This is due to the favorable intrinsic material properties of GaAs; the absorption length for 850 nm-radiation in GaAs is $\alpha^{-1}=1$ μm, and the electron mobility in GaAs is roughly 8500 cm$^2$/Vs at room temperature. J. S. Wang et al., *IEEE Phot. Tech. Lett.* 5, 316 (1993) demonstrated the fabrication of high-speed integrated photoreceiver circuits composed of GaAs metal-semiconductor-metal (MSM) photodiodes and MESFETs with −3 dB bandwidths as high as 11 GHz at λ=850 nm. Further improvement of GaAs-based receiver performance has been obtained using GaAs MSM photodetectors integrated with AlGaAs/GaAs modulation-doped field effect transistors (MODFETs). V. Hurm et al., *Electron. Lett.* 29, 9 (1993) demonstrated photoreceiver circuits of this type with −3 dB bandwidths as high as 14 GHz at λ=850 nm.

In order to replace GaAs, an integrated Si-based technology must have comparable performance to GaAs and a relatively low-cost process. However, the intrinsic material properties of Si are much less favorable compared to GaAs. The absorption length in Si for 850 nm-radiation is $\alpha^{-1}=20$ μm, which is over an order of magnitude longer than in GaAs. Therefore, for a Si photodetector to have high responsivity it must have a thick absorbing region making the detector very slow, and for high speed the absorbing region should be very thin resulting in an extremely poor responsivity. For instance, Y. S. He et al., *Electron. Lett.* 29, 9 (1993) demonstrated the operation of a lateral p-i-n photodiode integrated with a Si NMOS technology with a responsivity of 0.48 A/W at λ=870 nm, but with a −3 dB bandwidth of only 900 MHz. Moreover, these results were only made possible by using ultra-high purity Si, and an extremely large bias voltage of 30 V. On the other hand, M. Y. Liu et al., *Appl. Phys. Lett.* 65, 887 (1994) demonstrated operation of a Si on insulator (SOI) MSM photodiode with an absorbing region thickness of only 0.1 μm that had a bandwidth over 100 GHz, but a severely-degraded responsivity at λ=780 nm of 0.0057 A/W. Improvements in the bandwidth/responsivity tradeoff of Si photodiodes are possible, for instance, in U.S. Pat. No. 5,589,704 which was issued on Dec. 31, 1996 to B. F. Levine, the responsivity of an MSM detector was shown to increase by a factor of close to 4 by roughening the surface of a Si epi-layer grown on an SOI wafer. However such a technique is limited to use with SOI substrates, and may not be suitable for practical applications due to the complexities of the roughening process. Si photodetectors are further hindered by the fact that the electron mobility in Si/SiO$_2$ inversion layers is several times lower than GaAs at room temperature, and the frequency performance and gain of Si NMOS devices is considerably poorer compared to GaAs MESFETs.

In U.S. Pat. No. 5,525,828 which was issued on Jun. 11, 1996 to E. Bassous et al., it was noted that the speed and/or responsivity of Si MSM photodetectors could be increased by adding a certain percentage of Ge to the absorbing layer. Increasing the percent Ge-composition of Si$_{1-x}$Ge$_x$ alloy decreases the absorption length, and increases the electron and hole mobilities thereby leading to potentially faster devices.

It has also been shown that field-effect transistors fabricated on Si/Si$_{1-x}$Ge$_x$ layer structures offer considerable advantages over bulk Si transistors. For n-channel MODFETs incorporating tensile-strained Si/Si$_{1-x}$Ge$_x$ quantum wells, frequency performance is considerably better than Si MOSFETs for a given gate length device. Similar performance advantages can be obtained in p-channel MODFETs fabricated on compressive-strained Si$_{1-y}$Ge$_y$/Si$_{1-x}$Ge$_x$ quantum wells. For instance, M. Arafa et al., *IEEE Electron. Dev. Lett.* 17, 586 (1996) obtained unity current-gain cutoff frequencies of 70 GHz for 0.1 μm gate length p-channel transistors fabricated on compressive-strained Si$_{0.7}$Ge$_{0.3}$/Si$_{0.3}$Ge$_{0.7}$ heterostructures. In U.S. Pat. No. 5,659,187 which was issued on Aug. 19, 1997 to F. K. Legoues and B. S. Meyerson, it was shown that a low-defect density layer of relaxed Si$_{1-x}$Ge$_x$, with arbitrary Ge composition can be grown on a lattice-mismatched substrate using an intermediate graded-composition buffer layer where strain has been relieved in the buffer layer or below via activation of modified Frank Read sources which is a mechanism to generate new dislocations. This work demonstrated the practicality of producing devices and circuits using Si/SiGe heterostructures grown on a SiGe graded composition buffer layer on Si substrates. Finally, U.S. Pat. No. 5,534,713 which was issued on Jul. 9, 1996 to K. Ismail and F. Stern showed that complementary logic circuits could be fabricated using high-mobility electron and hole channels fabricated in strained Si/SiGe layers grown on relaxed SiGe buffer layers.

Despite the apparent advantages of SiGe technology over bulk Si for photodetectors, MODFETs, and CMOS logic circuits, the concept of combining these devices to form integrated photoreceiver circuits has not been suggested, nor has a clear method for monolithically integrating these structures in such a way as to allow high-frequency operation and low cost Si manufacturing been suggested.

It is an object of the present invention to provide a simple means of monolithically integrating a photodetector with high speed and responsivity with a microwave transistor on a Si substrate in such a way as to allow high frequency performance better than Si and comparable to that achievable in GaAs.

It is a further object of this invention to provide a method for fabricating an optoelectronic integrated circuit using a process that is fully compatible with standard Si processing.

It is still a further object of this invention to provide a means for monolithically integrating a high-speed photoreceiver circuit with a practical CMOS logic manufacturing technology.

SUMMARY OF THE INVENTION

A design and method of fabricating an optoelectronic integrated circuit (OEIC) on a Si substrate is presented. This is achieved by using a high-quality, Si/SiGe heterostructure grown on a Si substrate to monolithically integrate a high-speed and responsivity SiGe photodetector and a modulation-doped field effect transistor on the same wafer. A typical layer structure consists of a Si substrate, a graded Ge-content $Si_{1-x}Ge_x$ buffer layer, a thick, undoped relaxed $Si_{1-y}Ge_y$ buffer layer, a Si quantum well, a $Si_{1-y}Ge_y$ undoped offset layer, a doped $Si_{1-y}Ge_y$ supply layer, and optionally a Si surface layer may be incorporated. A MODFET can be fabricated on the layer structure using mesa isolation, and by defining source, drain and gate electrodes, while an MSM photodetector can be created on the etched surface by depositing interdigitated Schottky electrodes on the surface of an exposed buffer layer. The electrodes are configured in such a way that the application of a voltage between adjacent electrodes creates an electric field that penetrates into the underlying layers. Light or radiant energy incident from the surface creates free carriers in the buffer layer that travel to the electrodes, creating a current signal that is proportional to the power of the incident light. By using a bias resistor in series with the photodetector, a voltage is created which can be coupled to the gate of the MODFET, which, when connected to an appropriate load, amplifies the original optical signal.

The key aspect of this invention is that the $Si_{1-y}Ge_y$ buffer layer not only acts as a pseudosubstrate for the subsequent growth of a MODFET layer structure with carrier mobility greater than bulk Si, but also as a sensitive absorbing medium—with much greater sensitivity to infrared radiation than bulk Si—for a high-speed photodetector, thus providing a dual advantage over bulk Si integrated device structures. Specifically, the absorption coefficient for bulk Si at $\lambda=850$ nm is $\alpha^{-1}=20$ $\mu$m, but for $Si_{1-x}Ge_x$ with x=0.25, $\alpha^{-1}=8$ $\mu$m, an improvement by a factor of 2.5. This improvement can be enhanced by increasing the Ge composition of the $Si_{1-x}Ge_x$ alloy; for x=0.75, $\alpha^{-1}=5$ $\mu$m, which is a factor of 4 times greater than in bulk Si. The increased absorption leads to more photogenerated carriers for a given material thickness, and can allow the absorption layer thickness to be decreased, therefore decreasing the transit time of the carriers, and increasing the speed of the detector. The photodetector speed is further improved by using SiGe alloys because both the electron and hole mobilities are increased compared to bulk Si. At the same time, strained-layer structures grown on the relaxed SiGe buffer layers have greatly improved mobility compared to bulk Si structures, mainly due to the band splitting caused by the strain. The electron mobility in modulation-doped, tensile-strained Si quantum wells grown epitaxially on relaxed $Si_{1-y}Ge_y$ buffer layers can be a factor of 3 higher than standard Si/SiO$_2$ inversion layers. Similarly, the hole mobility in compressive-strained $Si_{1-z}Ge_z$ quantum wells grown on relaxed Si or $Si_{1-y}Ge_y$ buffer layers, where z>y, similarly show considerable improvement over Si/SiO$_2$ inversion layers. These improvements enable the fabrication of both n- and p-channel FETs that operate at higher frequencies, and have higher gain at a given frequency than Si MOSFET devices with the same gate length.

The present invention provides a design and method of fabricating a SiGe photodetector with improved speed and responsivity compared to bulk Si on the same substrate as a MODFET device that has improved gain and frequency performance compared to bulk Si, and performance comparable to that of GaAs, and thus providing a method of fabricating integrated photodetector circuits that are greatly improved over bulk Si, and comparable to those achievable in GaAs.

The invention further provides a means of optimizing the detector by varying the properties of the substrate material, by tailoring the Ge-composition in SiGe and the strain in the epitaxial layer structure, by varying the electrode materials, and by varying the photodetector and Si/SiGe MODFET designs. In this way, the invention is applicable to wavelengths other than $\lambda=850$ nm, depending upon the photodetection mechanism, Ge-content and strain of the layers.

The invention further provides a means of monolithically integrating a high-speed photodetector and a high-mobility transistor (MOSFET or MODFET) using a Si-manufacturing process incorporating SiGe epitaxial layers.

The invention further provides a means of monolithically integrating a high-speed photodetector and MODFET technology with a manufacturable CMOS logic process, enabling an entire optical/analog/digital subsystem to be fabricated monolithically on a chip.

BRIEF DESCRIPTION OF THE DRAWINGS

These and other features, objects, and advantages of the present invention will become apparent upon consideration of the following detailed description of the invention when read in conjunction with the drawing in which:

FIGS. 1A–1E are cross-sectional diagrams of the fabrication sequence of one embodiment of the invention where a metal-semiconductor-metal (MSM) photodetector and an n-channel modulation-doped field effect transistor (MODFET) are integrated using an epitaxially-grown Si/SiGe heterostructure.

DESCRIPTION OF THE PREFERRED EMBODIMENTS

Figure 2:
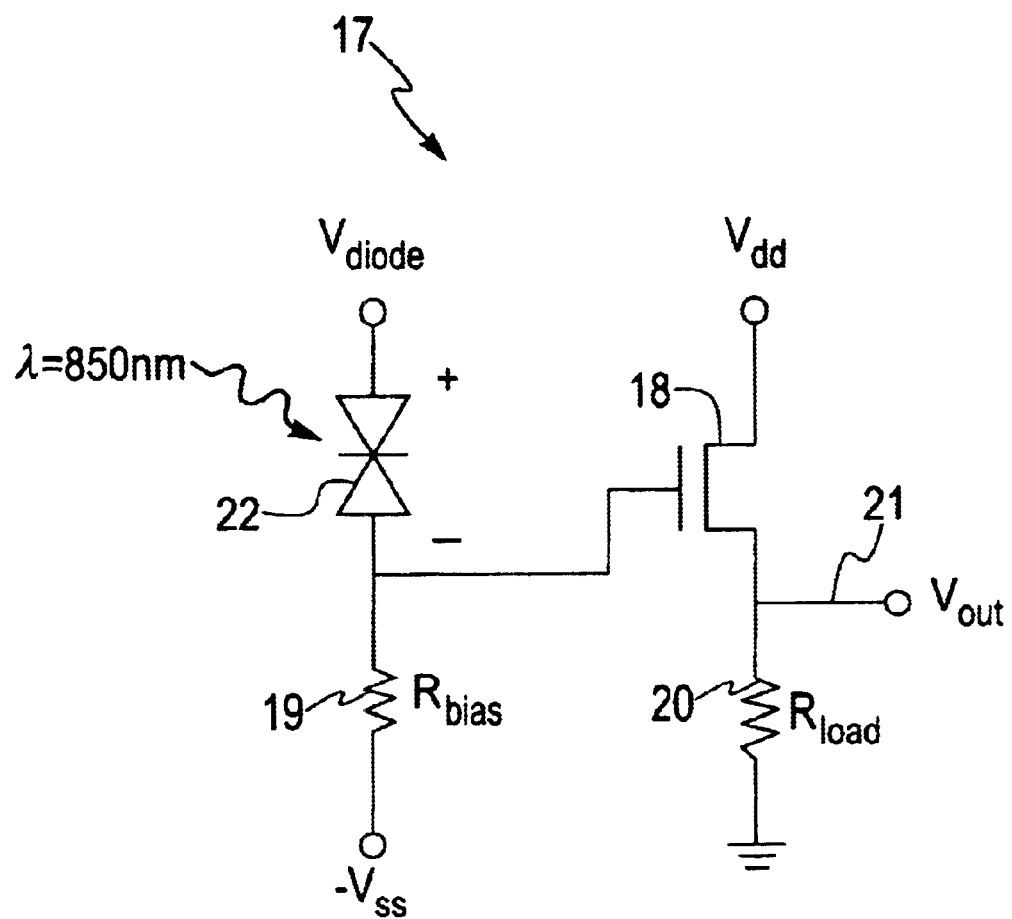
FIG. 2 is a circuit diagram of a simple photoreceiver circuit.

FIGS. 1A–1E show the fabrication sequence for one embodiment of the invention where an n-channel, Si/SiGe modulation-doped field effect transistor (MODFET) 15 is integrated with a SiGe metal-semiconductor-metal (MSM) photodetector. A typical layer structure is shown in FIG. 1A. The layers are epitaxially grown on a Si substrate 1 using a high-precision epitaxy technique such as molecular beam epitaxy, rapid thermal cheimcal vapor deposition, or ultra high vacuum chemical vapor deposition (UHV-CVD). Substrate 1 may also be SiGe, Ge, GaAs, SiC, SOS and SOI. Suitable adjustments will be required to accomodate a different substrate lattice constant compared to Si. The following description is directed to a Si substrate. For a description of how to grow epitaxial Si and $Si_{1-x}Ge_x$ layers by UHV-CVD, reference is made to U.S. Pat. No. 5,298,452 which was issued on Mar. 29, 1994 to B. S. Meyerson which is incorporated herein by reference. For $Si_{1-x}Ge_x$ layers, $GeH_4$ is added to Si-containing gas such as $SiH_4$ or $Si_2H_6$ in the UHV-CVD reactor. Ge is incorporated into the crystal lattice in place of Si during formation of the layer in the amount or proportion of x. Layer 2 comprises a $Si_{1-x}Ge_x$ buffer layer that has a thickness in the range from 0.2 to 1.5 $\mu$m, with a preferred value of about 0.5 $\mu$m, and has a percent Ge composition that is increased from x=0 (in a continuous or stepwise fashion) to a value in the range from x=0.10 to 1.0 with a preferred value of x=0.25. Layer 2 serves to relax the strain caused by the lattice mismatch between layer 2 of graded Ge composition $Si_{1-x}Ge_x$ and Si substrate 1. Ge has a lattice spacing of 1.04 times the lattice spacing of Si. Thus for a relaxed top surface of buffer layer 2 where x equals 0.25, the lattice spacing of the unit cell along each axis in the top surface is about 1.01 times the lattice spacing of the unit cell of Si along each axis. For a description of how to grow relaxed low defect top surfaces of $Si_{1-x}Ge_x$ layers, reference is made to U.S. Pat. No. 5,659,187 which was issued on Aug. 19, 1997 to F. K. Legoues and B. S. Meyerson which is incorporated herein by reference. After the graded region of layer 2, a 0.25 to about 10 $\mu$m thick, undoped or not-intentionally doped layer 3 of $Si_{1-y}Ge_y$ is grown, where the Ge composition, typically y=0.25, is in the range from y=0.10 to 1.0. Layer 3 acts as the absorbing medium for radiant energy as well as a relaxed, device quality pseudosubstrate for growth of subsequent layers. The background impurities in layer 3 should be low enough to allow penetration of the electric field from the surface electrodes into the entire layer.

In one embodiment, the subsequent layers are a Si quantum well layer 4, a $Si_{1-y}Ge_y$ undoped or not-intentionally doped offset layer 5, a doped $Si_{1-y}Ge_y$ supply layer 6 and optionally a Si layer 7. By an undoped layer, it is meant a not-intentionally doped layer which may have a background dopant concentration so low as to not substantially affect the function of the layer. The Ge composition of layers 5 and 6 are in the range of y=0.1 to 1.0 and y is preferably the same as the composition of layer 3. A quantum well for electrons is formed in Si layer 4 due to the conduction band splitting arising from the tensile strain in Si layer 4. The isolation for MODFET 15 is achieved by forming an etched mesa region, thereby exposing the surface 8 of $Si_{1-y}Ge_y$ buffer layer 3 in the etched regions, as shown in FIG. 1B. Next, in FIG. 1C, n-type implanted regions 9 are formed to facilitate making low-resistance contacts to the Si quantum well layer 4. The source and drain metallization 10 can then be deposited as depicted in FIG. 1D, followed by the gate metallization 12 shown in FIG. 1E.

The MSM photodetector is created by depositing interdigitated Schottky electrodes 11 on the exposed surface 8 of buffer layer 3. To simplify the fabrication process, it is possible for MSM electrodes 11 to be defined in the same lithographic step as the Ohmic metallization 10, as depicted in FIG. 1D. MSM electrodes 11 are configured in such a way such that a bias applied between adjacent electrodes, as shown in FIG. 1E, creates an electric field that penetrates into the underlying absorbing layer 3. Light or radiant 14 energy incident from or passing through surface 8 creates free carriers, electrons 15 and holes 16, in layer 3 that travel to electrodes 11, creating a current signal that is proportional to the power of the incident light.

FIG. 2 depicts the manner in which the devices shown in FIG. 1 are connected to form a simple photoreceiver circuit 17. A bias voltage, $V_{diode}$, is applied to the positive MSM electrode, while the negative electrode is connected to the gate of depletion-mode transistor 18, and to a bias resistor 19, $R_{bias}$, which is connected to a negative supply voltage, $-V_{ss}$. The transistor source is connected to ground, while the drain is connected to a load resistor 20, $R_{load}$, which is connected to the supply voltage, $V_{dd}$. In this configuration, the photocurrent induced by the incident light creates a voltage across the bias resistor 19 which is input to the gate of the transistor 18, thereby modulating the transistor current, and creating an amplified signal at the output lead 21, $V_{out}$. Resistors 19 and 20 may be formed and interconnected on the chip with the photodetector 22 and transistor 18 which is well known in the art. Other optoelectronic circuits may be formed which for example use more transistors to optimize the circuit to the application.

Figure 3:
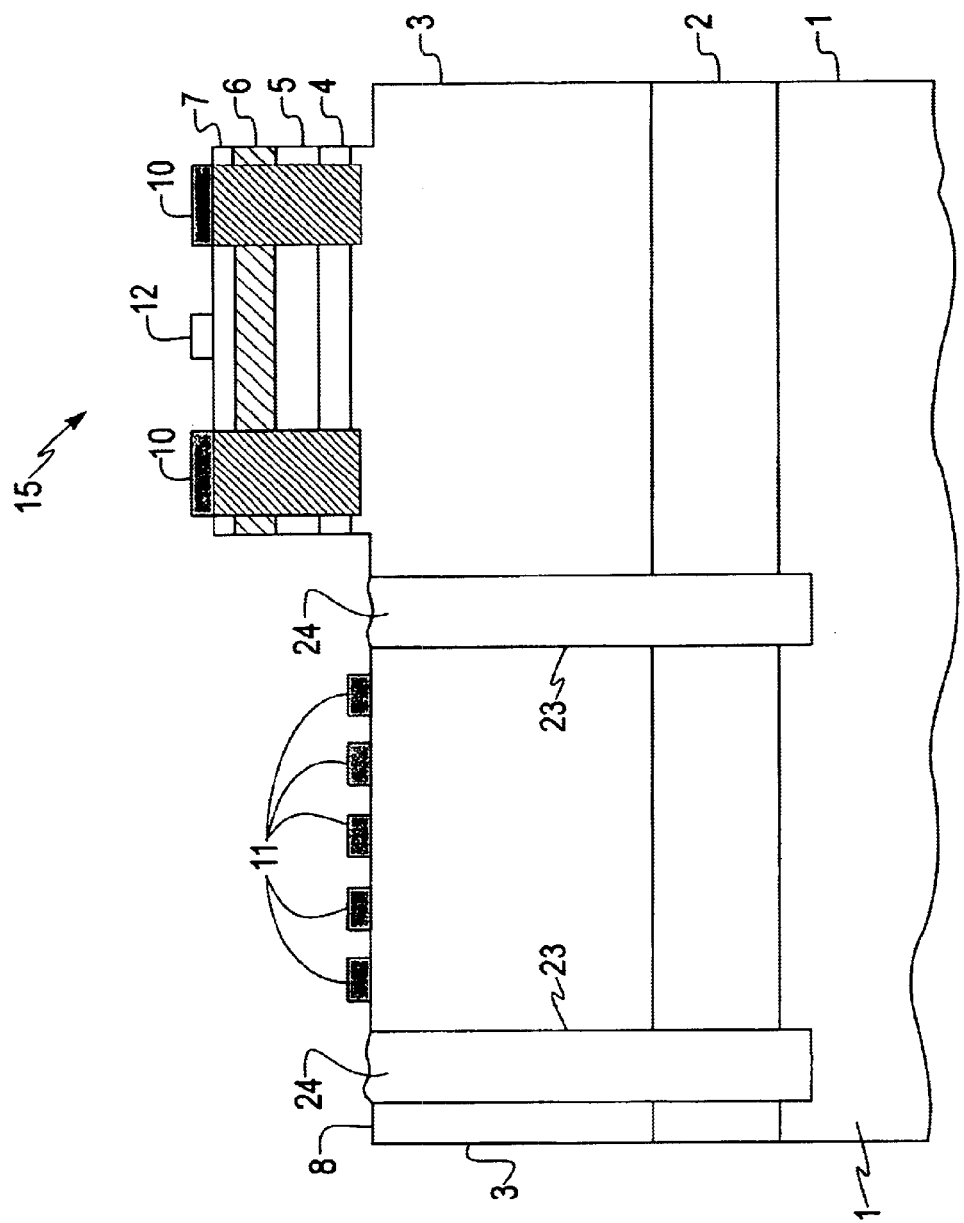
FIG. 3 is a cross-sectional diagram of a second embodiment of the invention, where an n-channel Si/SiGe MODFET is integrated with a SiGe MSM photodetector with planar, deep trench isolation.

FIG. 3 shows another embodiment of the invention that is the same as that shown in FIG. 1E, except that the MSM photodetector is surrounded by a deep isolation trench 23 that extends from the surface 8 of the relaxed buffer layer 3 down into the substrate 1. Isolation trench 23 serves to confine the carriers that are generated in $Si_{1-y}Ge_y$ buffer layer 3 from diffusing laterally outside the region directly beneath the detector geometry. The trench also serves to isolate slow carriers generated outside the high-field region directly beneath the detector geometry from being collected by the surface electrodes 11, thereby leading to improved high-frequency performance. Furthermore, deep isolation trench 23 can be planarized by filling with a dielectric material 24. The trench can readily be incorporated into the fabrication scheme shown in FIGS. 1A–1E, by etching deep isolation trench 23 before the mesa isolation in FIG. 1B, then filling the trench with dielectric material 24, followed by a planarization step. The subsequent fabrication steps can then be performed as depicted in FIG. 1B–1E.

Figure 4A:
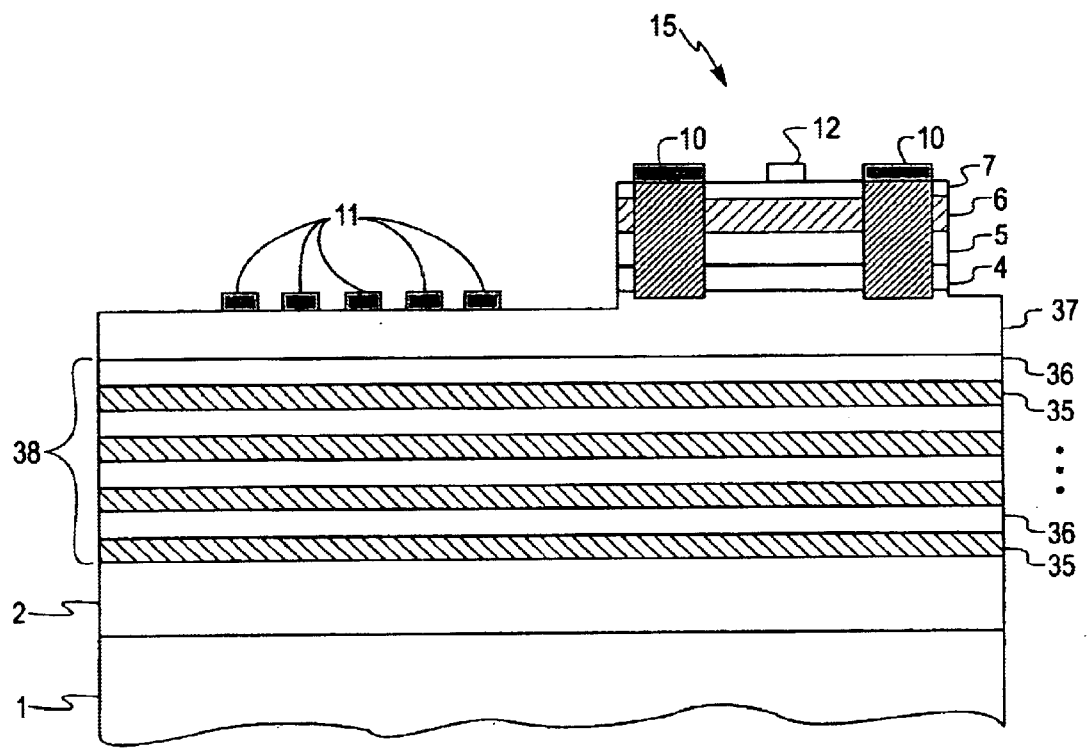
FIG. 4A is a cross-sectional diagram of a third embodiment of the invention where the absorbing layer is composed of a symmetrically-strained superlattice.
Figure 4B:
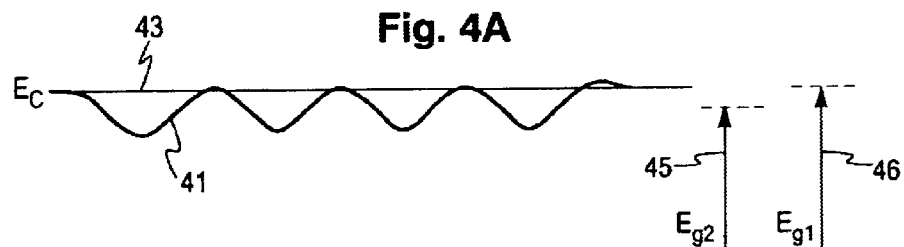
FIG. 4B is an energy-band diagram of the absorbing layer in FIG. 4A.

FIG. 4A shows another embodiment of the invention that is the same as that shown in FIG. 1E, except that the relaxed buffer layer 38, over layer 2, is composed of a symmetrically strained superlattice instead of a constant-composition alloy $Si_{1-y}Ge_y$. The superlattice consists of alternating layers of $Si_{1-x}Ge_x$, 35, and $Si_{1-z}Ge_z$, 36, where x<y<z, and have Ge-compositions such that the average composition in buffer layer 38 is equal to y where y is in the range from 0.1 to 0.9, with a preferred value of 0.25. The tensile strain in $Si_{1-x}Ge_x$ layer 35, and the compressive strain in $Si_{1-z}Ge_z$ layer 36 enhances the absorption of radiation by reducing the effective band gap of buffer layer 38. To ensure that the photo-generated carriers are not trapped in the potential wells formed by strained layers 35 and 36, the Ge composition of buffer layer 38 can be graded in a continuous fashion, to produce a smooth, rather than abrupt, potential profile. This situation is shown schematically in FIG. 4B, where the conduction and valence band edges, shown by curves 41 and 42, of alternating strained layers 35 and 36 are plotted along with the conduction and valence band edges, shown by curves 43 and 44, of a constant composition layer. The average band gap of the symmetric superlattice $E_{g2}$, shown by arrow 45, is reduced compared to that of the constant composition layer, $E_{g1}$, shown by arrow 46, leading to greater photoabsorption in the symmetric superlattice. The operation of the MODFET 15 structure shown in FIG. 4A is not affected by the symmetric superlattice because no net strain is built up in layer 38. Therefore, after the growth of the superlattice 38, only a thin, constant-composition $Si_{1-y}Ge_y$ layer 37, needs to be deposited before growing the MODFET 15 layers 4–7. For layer 37, y is in the range from 0.1 to 0.9, and is preferably equal to the average Ge-composition of layer 38.

Figure 5:
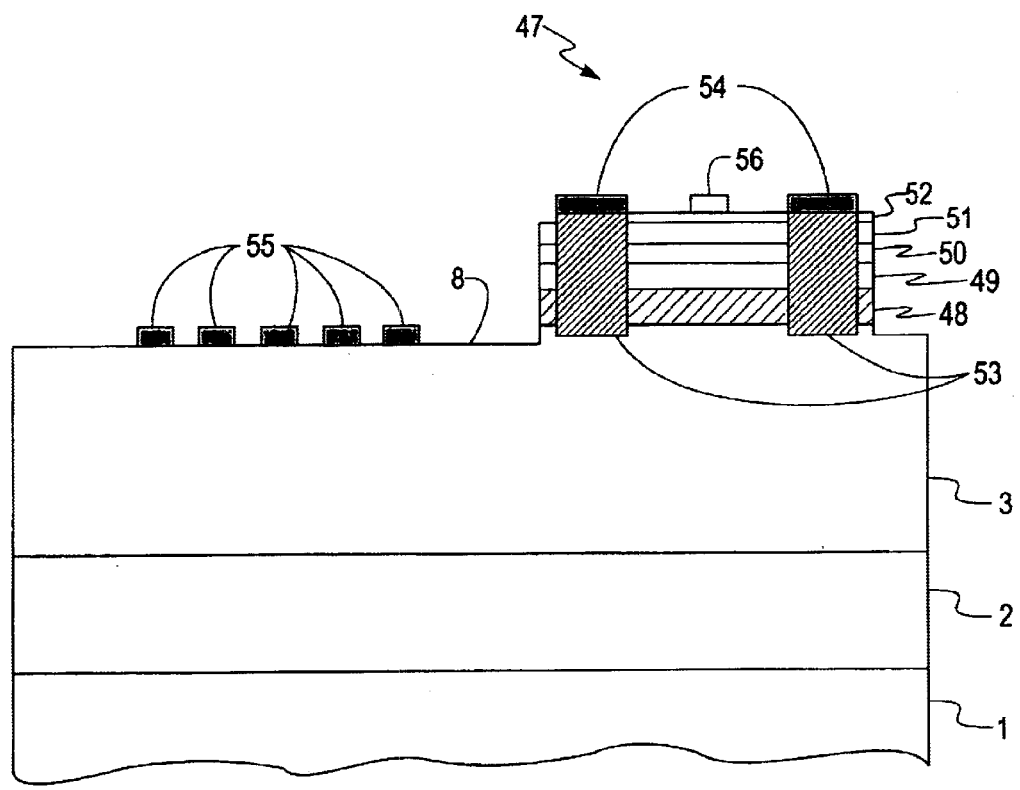
FIG. 5 is a cross-sectional diagram of a fourth embodiment of the invention where an MSM photodetector and a p-channel MODFET are integrated using an epitaxially-grown Si/SiGe heterostructure.

Another embodiment of the invention is shown in FIG. 5, where a SiGe MSM photodetector is integrated with a p-channel MODFET 47. This configuration consists of a graded buffer layer 2 followed by a constant composition $Si_{1-y}Ge_y$ absorbing layer 3, similar to that of FIGS. 1A–1E. These layers are followed by a layer structure for a p-channel MODFET 47, consisting of a $Si_{1-w}Ge_w$, doped layer 48, where w<y, an undoped $Si_{1-y}G_y$ layer 49, a compressive-strained $Si_{1-z}Ge_z$ quantum well layer 50, where z<y, an undoped $Si_{1-y}Ge_y$ layer 51, and optionally a thin Si layer 52. The Ge percentages for this embodiment can vary from y=0.1 to 0.9, w=0 to 0.5, and z=0.5 to 1.0. This embodiment could be particularly useful because of high Ge-content buffer layer 3 produces very efficient optical absorbtion, yet is also ideal for producing very high hole mobilities in p-channel MODFETs due to the compressive strain in the $Si_{1-z}Ge_z$ quantum well layer 50, particularly for the case of a pure-Ge channel where the mobility is not degraded by alloy scattering. MODFET 47 can be fabricated similar to the n-type device process shown in FIGS. 1A–1E, where a mesa etch is used to isolate MODFET 47 and expose the surface 8 of photodetector absorbing layer 3. Next, p-type implanted regions 83 are formed to create low-resistance contacts to the $Si_{1-z}Ge_z$ quantum well layer 50. The source and drain metallization 54 can then be deposited, followed by the gate metallization 56. The embodiment in FIG. 5 could also be fabricated with a reduced number of fabrication steps by defining the MSM electrodes 55 in the same lithographic step as the gate metallization 56 for MODFET 47.

Figure 6A:
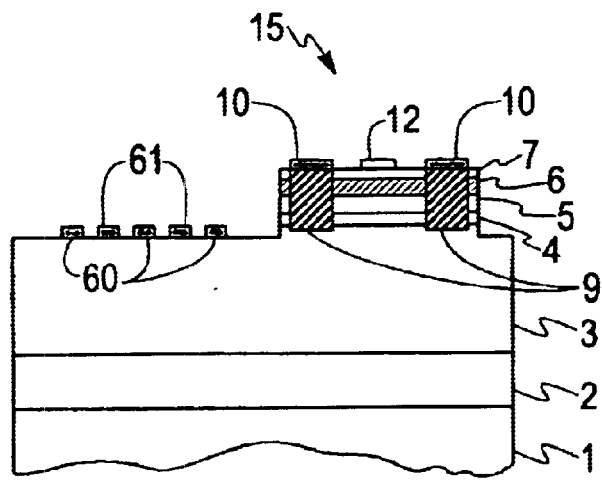
FIG. 6A is a cross-sectional diagram of a fifth embodiment of the invention where the positively (negatively) biased electrode of the MSM photodetector is composed of a material with high Schottky barrier for holes (electrons).

As the Ge content of the buffer layers is increased, the band gap shrinks, leading to larger dark currents for the photodiode. A method of reducing the dark current without a dramatic increase in process complexity is to use different materials for alternate electrodes of the photodetector. FIG. 6A shows one embodiment of the invention, where the positively-biased electrodes 60 of the MSM photodiode have a high Schottky barrier height for holes, and the negatively-biased electrodes 61 have a high Schottky barrier height for electrons. To simplify the fabrication process, it is possible for the positively-biased (negatively-biased) electrodes 60 (61) to be defined in the same lithographic step as the Ohmic (gate) metallization, 10 (12). Possible candidates for the positively-biased MSM electrodes and Ohmic contact material are Er, W, Ti, Ni and Co, while the negatively-biased MSM electrodes and gate material might be Pt or Ir.

Figure 6B:
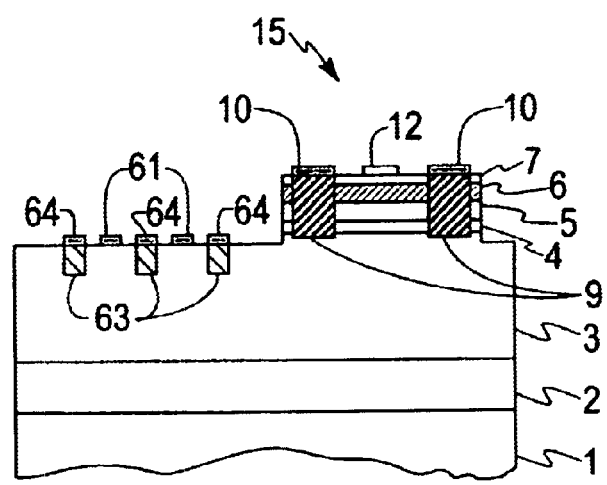
FIG. 6B is a cross-sectional diagram of a sixth embodiment of the invention where the negatively biased photodetector electrode is composed of a material with high Schottky barrier for electrons, and the positively biased electrode is composed of an n-type Ohmic contact.

FIG. 6B shows another embodiment of the invention where negatively biased photodiode electrode 61 is composed of a material with high Schottky barrier for electrons, such as Pt or Ir, and the positively biased electrode is composed of n-type doped region 63, and electrode 64 which makes an Ohmic contact to region 63. As in FIG. 6A, the fabrication process can be simplified by fabricating n-type doped region 63 and positively-biased electrode 64 at the same time as MODFET 15 source-drain implant 9, and Ohmic metallization 10, and negatively-biased electrode 61 at the same time as MODFET gate metallization 12.

Figure 6C:
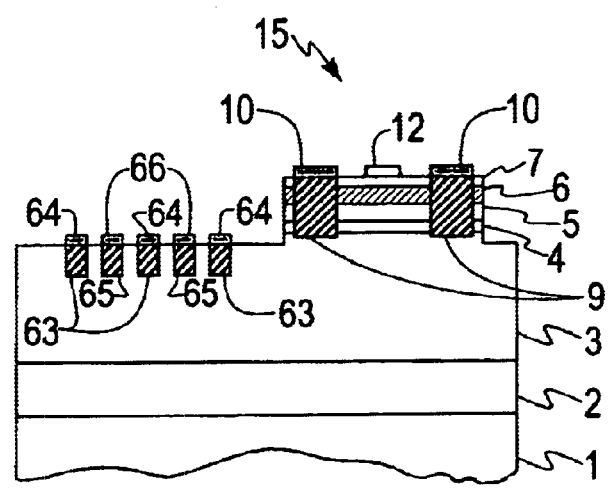
FIG. 6C is a cross-sectional diagram of a seventh embodiment of the invention where the positively (negatively) biased photodetector electrode is composed of an n-type (p-type) Ohmic contact.

FIG. 6C shows another embodiment of the invention where the photodiode consists of a lateral p-i-n geometry, and where the positively-biased photodiode:.electrode is composed of n-type doped region 63, and electrode 64 which makes an Ohmic contact to region 63, and the negatively-biased photodiode electrode is composed of p-type doped region 65, and an electrode 66 which makes an Ohmic contact to region 65.

Figure 7A:
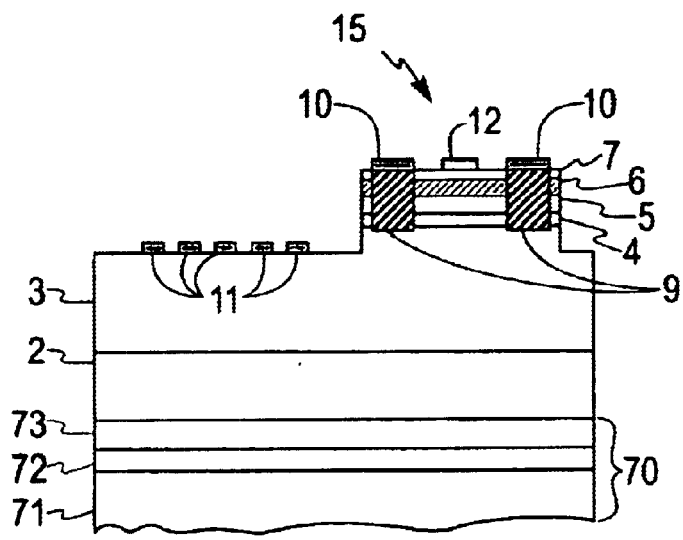
FIG. 7A is a cross-sectional diagram of an eighth embodiment of the invention where the substrate is an SOI wafer.

The photodetector performance can be optimized by varying the properties of the substrate. For instance, FIG. 7A shows a structure similar to FIG. 1E, where the substrate is an SOI wafer 70 and consists of a thick Si substrate 71, a $SiO_2$ layer 72, and a roughly 200 nm-thick Si layer 73. Without degrading MODFET 15 performance, $SiO_2$ layer 72 can improve the performance of the SiGe MSM photodetector by preventing slow carriers generated in Si substrate 71 below $SiO_2$ layer 72 from reaching the MSM surface electrodes 11, thereby increasing the detector speed. The amount of light reflected back into buffer layer 3 can be maximized by adjusting the thickness of $SiO_2$ layer 72 to equal odd integer multiples of $\lambda/4n$, where $\lambda$ is the wavelength of the incident light, and n is the refractive index of $SiO_2$.

Figure 7B:
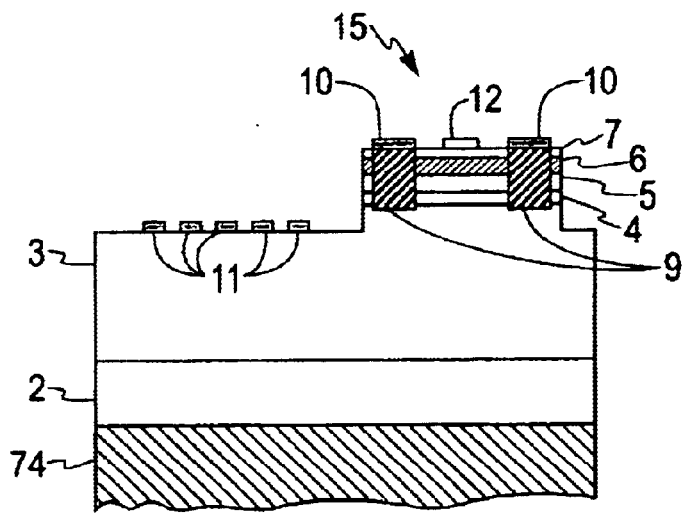
FIG. 7B is a cross-sectional diagram of a ninth embodiment of the invention where the substrate is a heavily-doped n- or p-type Si wafer.

Similarly, as shown in FIG. 7B, the substrate could consist of a heavily doped ($>10^{18}$ cm$^{-3}$) Si wafer 74 that causes photogenerated carriers in the layer to recombine before they can reach surface electrodes 11. The heavily-doped substrate 74 also acts to prevent the electric field produced by MSM interdigitated electrodes 11 from penetrating into substrate 74, thereby increasing the electric field strength in undoped SiGe absorbing layer 3, and subsequently increasing the detector speed.

Figure 7C:
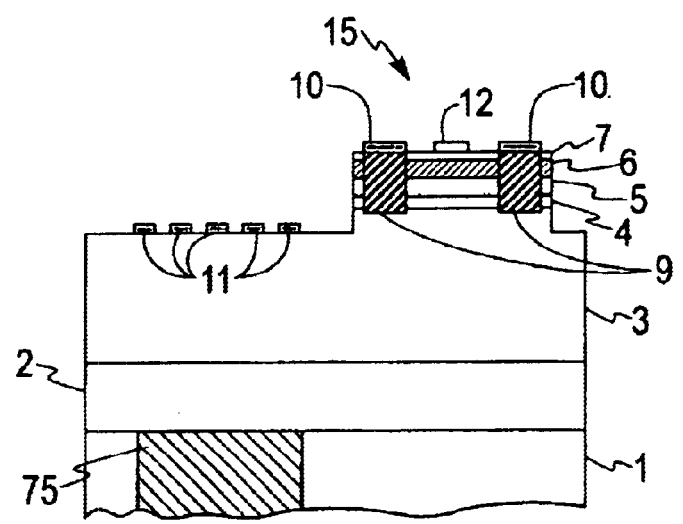
FIG. 7C shows a cross-sectional diagram of a tenth embodiment of the invention where the substrate has a heavily-doped implanted region located directly underneath the MSM photodetector.

As shown in FIG. 7C, the substrate capacitance can be reduced compared to the embodiment shown in FIG. 7B by selectively doping substrate 1 only in region 75 underneath MSM interdigitated electrodes 11. Selectively-doped region 75 can easily be formed before the growth of the Si/SiGe epi-layers using ion implantation, and then later aligned to MSM interdigitated electrodes 11.

Figure 8A:
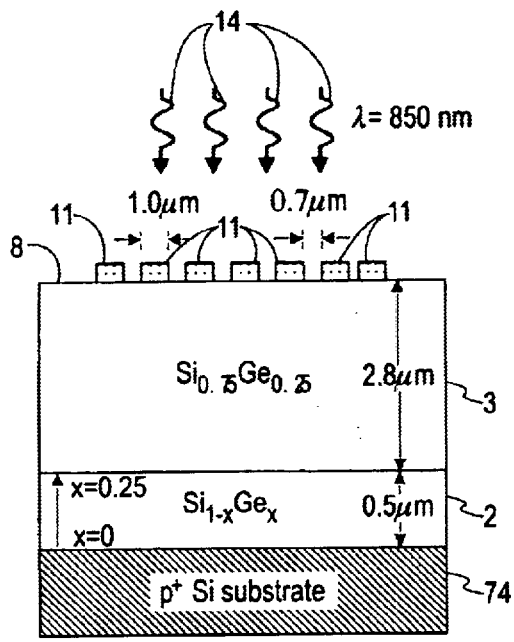
FIG. 8A shows a cross-sectional view along the line 8A—8A of FIG. 8B.
Figure 8B:
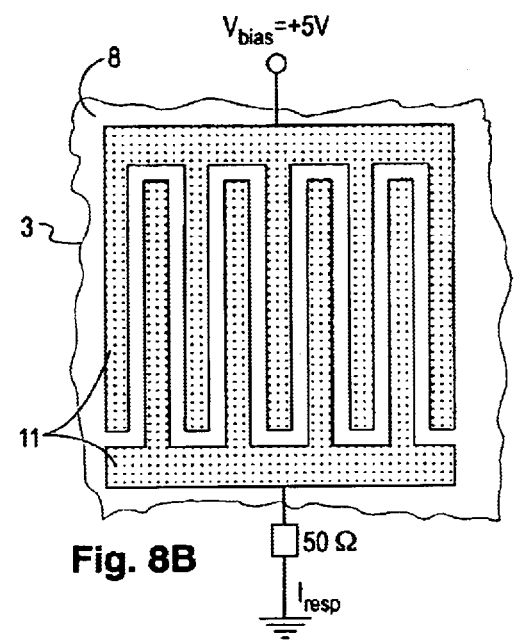
FIG. 8B shows a top view of a SiGe MSM photodetector.
Figure 8C:
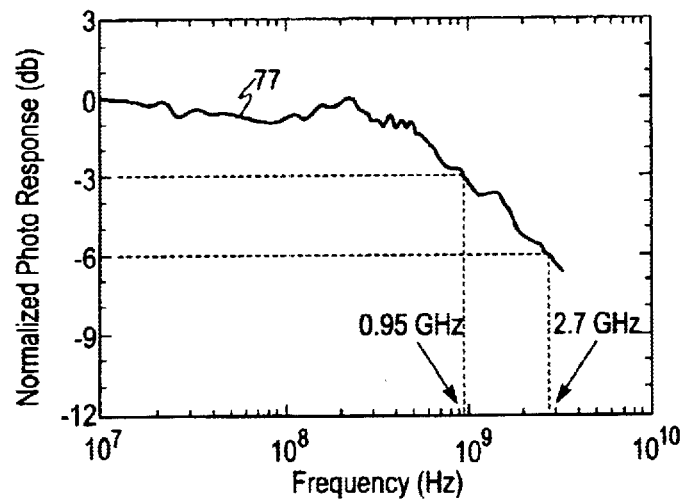
FIG. 8C is a graph of the normalized photoresponse versus frequency of the SiGe MSM photodetector shown in FIGS. 8A and 8B.

FIG. 8C, curve 77, is a graph of the frequency response of the SiGe MSM photodetector comprising a $Si_{0.75}Ge_{0.25}$ absorbing layer at a thickness of 2.8 μm depicted in the cross-sectional and top-view diagrams of FIGS. 8A and 8B. In FIG. 8C, the ordinate represents normalized photoresponse (dB) and the abscissa represents frequency (Hz). This device had a dc responsivity of 0.1 A/W, and displayed a –3 dB (–6 dB) bandwidth of 0.95 GHz (2.7 GHz), at λ=850 nm, for a bias voltage of +5 V. To our knowledge, this is the highest bandwidth achieved to date for a crystalline SiGe MSM photodetector for an incident radiation of λ=850 nm.

Figure 9:
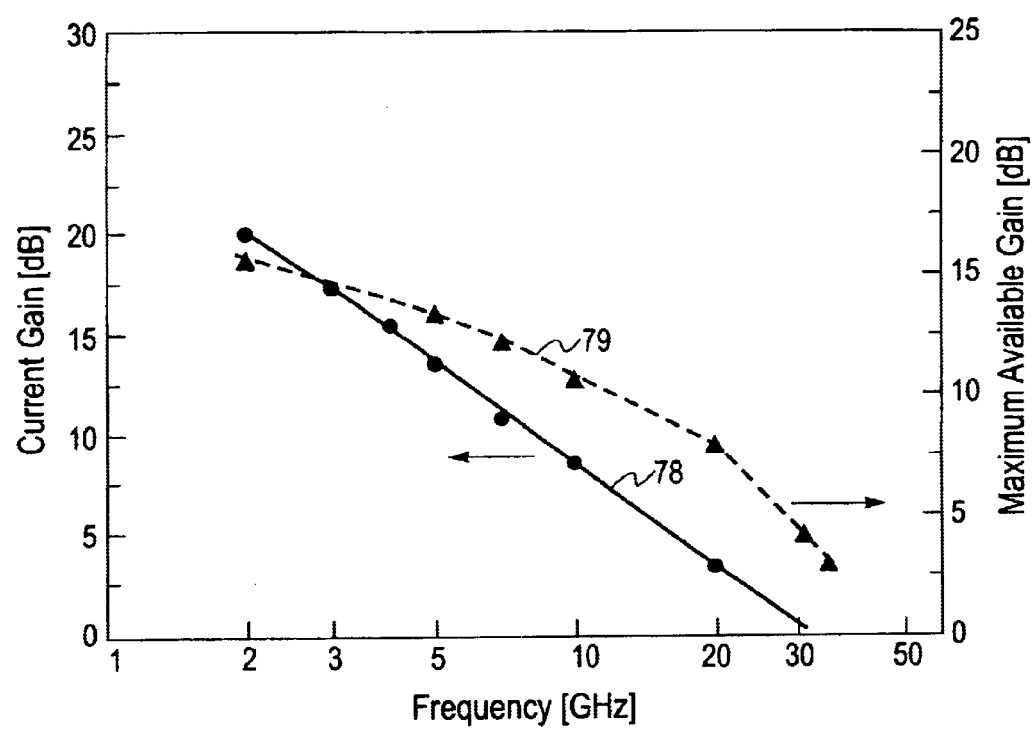
FIG. 9 is a graph of current gain and of maximum available gain plotted versus frequency for an n-channel Si/SiGe MODFET.

FIG. 9 shows the frequency response of an n-channel MODFET fabricated very similar to MODFET 15 shown in FIG. 1E. In FIG. 9, curve 78 shows the current gain versus frequency of the n-channel MODFET and curve 79 shows the maximum available gain versus frequency. In FIG. 9, the left ordinate represents current gain (dB), and the right ordinate represents maximum available gain (dB), and the abscissa represents frequency. The device shows a unity-gain cutoff frequency of 31 GHz, for a gate length of 0.7 μm, performance which is far superior to bulk Si MOSFETs of the same gate length. These results shown by curve 77 in FIGS. 8C and by curves 78 and 79 in FIG. 9 on the individual components of the integrated circuit indicate the viability of the present invention, particularly given the straightforward method of integration described herein.

Figure 4B:
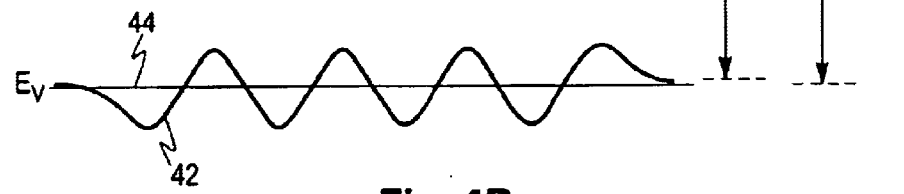
Figure 10:
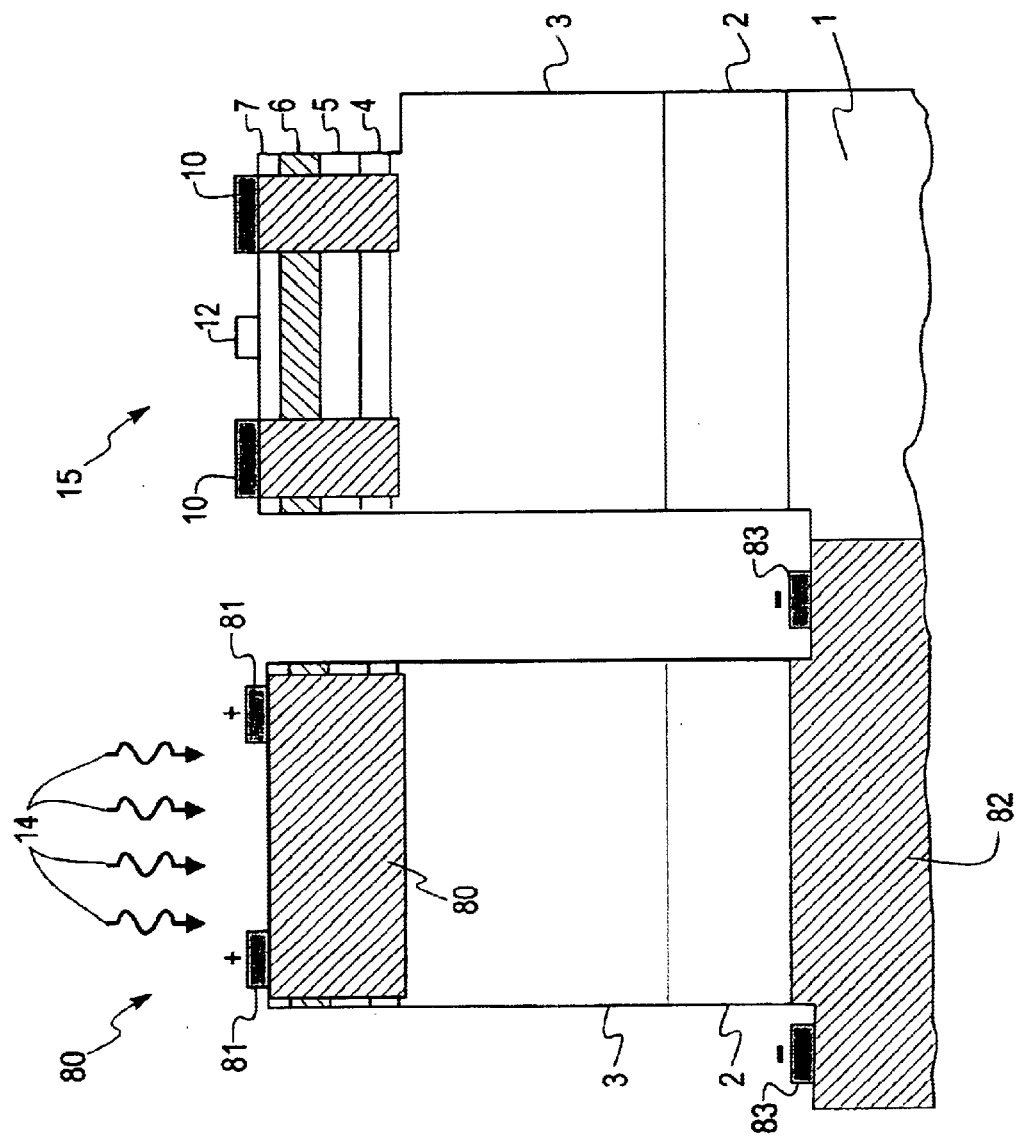
FIG. 10 is a cross-sectional diagram of a eleventh embodiment of the invention where a vertical p-i-n photodetector and an n-channel MODFET are integrated using an epitaxially-grown Si/SiGe heterostructure.

The selectively-doped substrate configuration shown in FIG. 7C can also be modified to integrate a vertical p-i-n photodetector 80 with an n- or p-channel MODFET 15. One such embodiment is shown in FIG. 10, where p-i-n photodetector 80 and an n-channel MODFET 15 are fabricated using an n-type modulation-doped heterostructure, as described in FIG. 1E. In this embodiment, the p-i-n photodetector 80 is created when an n-type implanted region 80 and top contact 81 are aligned to a heavily-doped p-type region 82 created before the growth of the Si/SiGe epi-layers 2 and 3. The bottom contact 83 is made by etching down to and into substrate 1 as shown in FIG. 10. The embodiment in FIG. 10 has the advantage that the n-channel, modulation-doped regions 4–7 do not need to be etched away to make top contact 81 of the p-i-n detector 80, because this contact already needs to be doped n-type. This embodiment can also be used with a buffer layer 38 consisting of a symmetric superlattice as described in FIG. 4. MODFET 15 shown in this embodiment is an n-channel device. For integration with a p-channel MODFET, the doping and polarity of the p-i-n contacts 80-83 can be reversed. The p-i-n configuration has the advantage that the carriers are always generated in a high-field region, and the distance the photogenerated carriers have to travel is reduced because detector electrodes 81 and 83 are on both the top and bottom of absorbing region 3.

Figure 11:
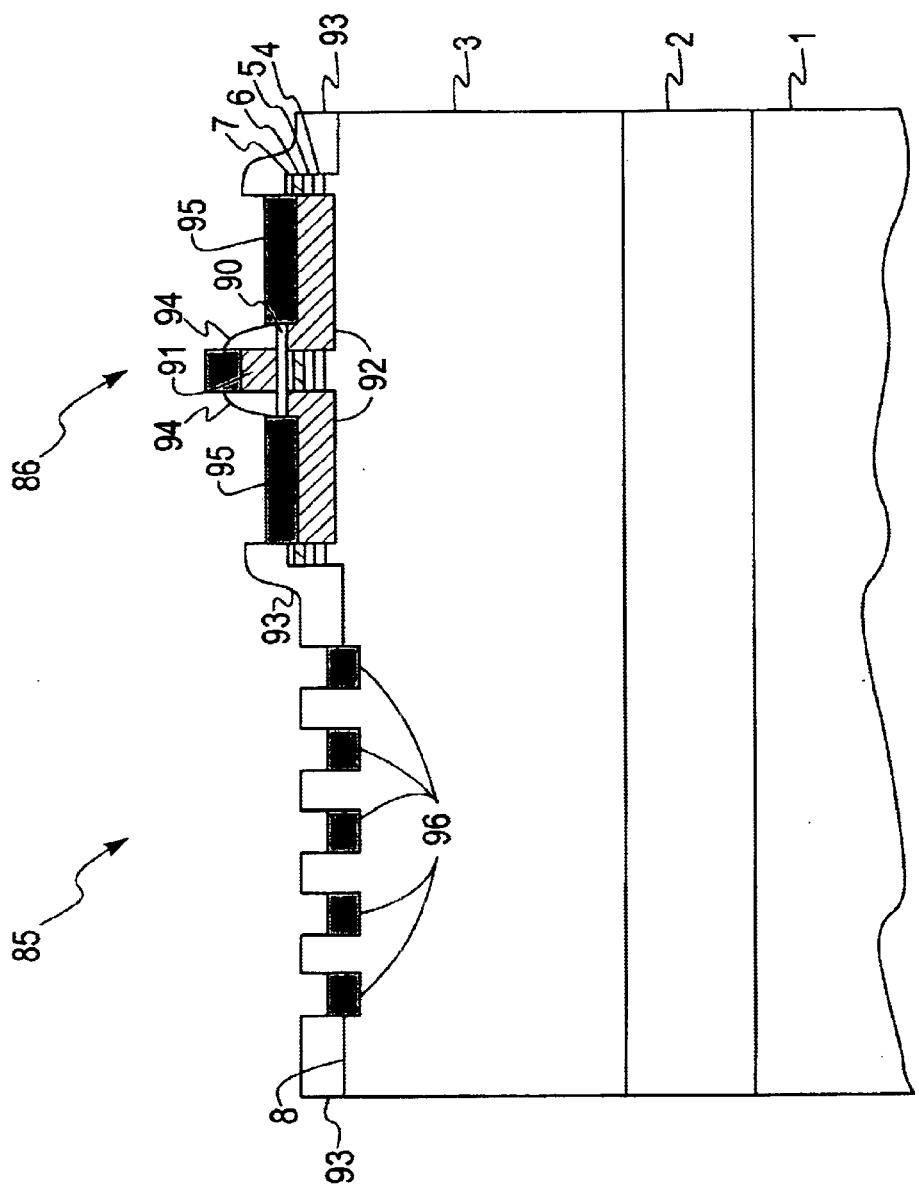
FIG. 11 is a cross-sectional diagram of a twelfth embodiment of the invention where an MSM photodetector and an n-channel modulation-doped MOSFET are integrated using a standard self-aligned poly-gate, salicide process.

FIG. 11 shows how an MSM photodiode 85 and MODFET 86 can be integrated using a fabrication scheme similar to that of a standard Si MOSFET or CMOS process. In the preferred embodiment, the layer structure is the same as that used in FIG. 1A. The MODFET 86 can be fabricated by depositing a thin gate oxide layer 90 followed by an undoped poly-silicon layer that is patterned and etched to define the gate electrode 91. Next an ion implant is performed to define n-type source and drain regions 92 where poly-silicon gate electrode 91 is used as a self-aligned implant mask. Next, a mesa isolation etch is performed which exposes the surface 8 of the buffer layer 3 in the etched regions. Next an insulating layer 93, such as silicon nitride, is deposited and then etched to form sidewall spacer regions 94. Finally, a self-aligned silicide (salicide) process is performed, where metal is deposited, heated to form metal-silicide or metal-germanosilicide contacts 95 to n-type source and drain regions 92 and the unreacted metal selectively etched away. The main feature of this embodiment is that the MSM photodetector 85 can be fabricated at the same time as MODFET 86 source and drain contacts 95 using the salicide process, by patterning windows in insulating layer 93 above SiGe buffer layer 3 to form metal-silicide or metal-germanosilicide photodetector electrodes 96 in openings of insulating layer 93.

Figure 12:
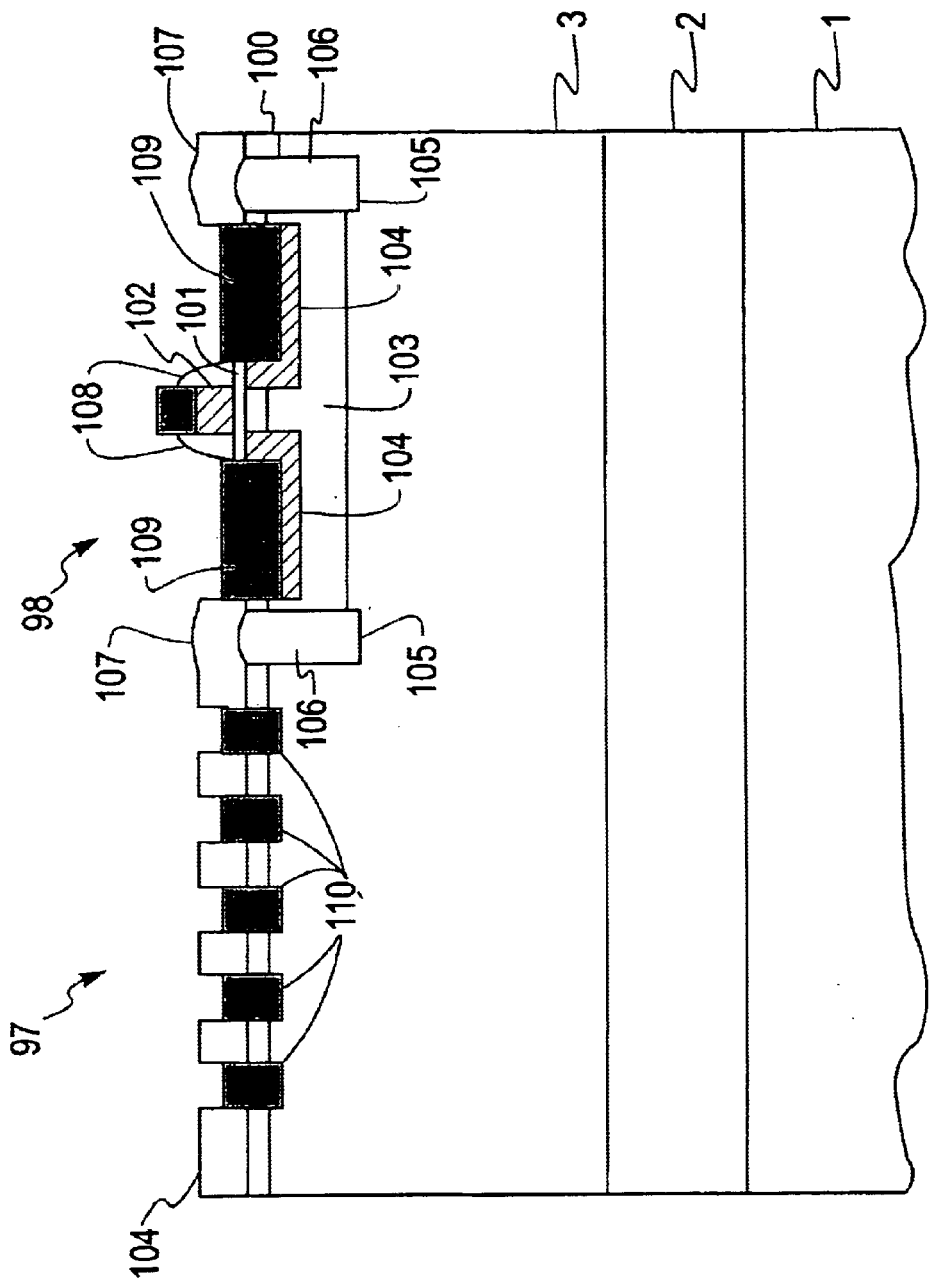
FIG. 12 is a cross-sectional diagram of a thirteenth embodiment of the invention where an MSM photodetector and a strained Si n-MOSFET are integrated using a planar fabrication process.

FIG. 12 shows another embodiment of the invention where a SiGe MSM 97 and a strained-Si n-channel MOSFET 98 are integrated using a planar processing scheme. For this structure, the layer structure consists of the same graded $Si_{1-x}Ge_x$ layer 2 and constant composition, $Si_{1-y}Ge_y$ buffer layer 3 grown on Si substrate 1 as shown in FIG. 1E. On top of buffer layer 3 is grown a tensile-strained Si layer 100, as shown in FIG. 12. In the preferred embodiment, the MOSFET 98 is fabricated by depositing or growing a thin gate oxide layer 101, followed by an undoped poly-silicon layer, which is patterned and etched to define the gate electrode 102. Next an optional p-well implant 103, is performed for threshold voltage control, and an ion implant is performed to define n-type source and drain regions 104, where poly-silicon gate electrode 102 is used as a self-aligned implant mask. Next, trench isolation regions 105, are formed and filled with dielectric material 106, and a second insulating layer 107, such as silicon nitride, is deposited and etched to form sidewall spacer regions 108. Finally, a self-aligned silicide (salicide) process is performed, where metal is deposited, heated to form metal-silicide, or metal-germanosilicide contacts 109 on n-type source and drain regions 104, and the unreacted metal selectively etched away. The MSM photodetector 97 is fabricated using the same salicide process used to create the MOSFET 98 source and drain regions, by patterning windows in insulating layer 107 above SiGe buffer layer 3 to form metal-silicide or metal-germanosilicide photodetector electrodes 110 in the openings of insulating layer 107. This embodiment has the advantage of utilizing a planar processing scheme, because Si layer 100 is not etched away. Because Si layer 100 is only ~10 nm thick, it has little effect on the photoabsorption, and can act as a stable surface material for formation of MSM electrodes 110.

Figure 13:
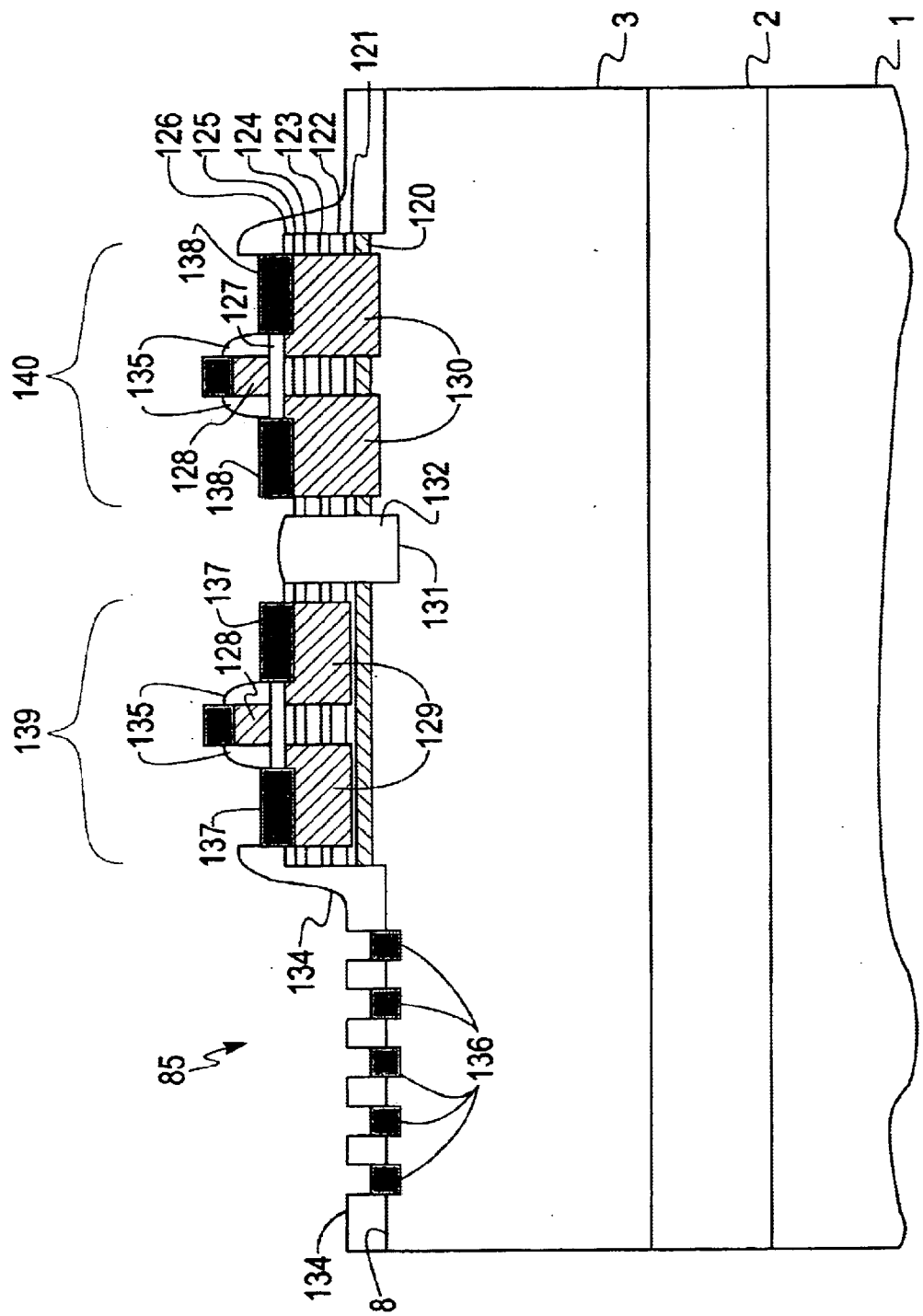
FIG. 13 is a cross-sectional diagram of a fourteenth embodiment of the invention where an MSM photodetector is integrated with both an n-channel and a p-channel MODFET using an epitaxially-grown Si/SiGe heterostructure.

FIG. 13 shows another embodiment of the invention where MSM photodetector 85 is integrated with both a p-channel and an n-channel Si/SiGe MOSFET, 139 and 140, using an epitaxal multi-layer structure. The layer structure consists of a Si substrate 1, a graded $Si_{1-x}Ge_x$ layer 2 and constant composition $Si_{1-y}Ge_y$ buffer layer 3 as described in FIG. 1A. In the preferred embodiment, on top of $Si_{1-y}Ge_y$ buffer layer 3 are grown an n-type doped $Si_{1-y}Ge_y$ supply layer 120, an undoped $Si_{1-y}Ge_y$ offset layer 121, a tensile-strained Si quantum well layer 122, which acts as the electron channel for the NMOS device, another undoped $Si_{1-y}Ge_y$ offset layer 123, a compressive-strained $Si_{1-z}Ge_z$ layer 124, where z>y, which acts as the hole channel for the PMOS device, an undoped $Si_{1-y}Ge_y$ offset layer 125, and an undoped Si layer 126. In this embodiment, the Ge-percentages of layers 120, 121, 123 and 125 is in the range y=0.1 to 0.9, with a preferred value of y=0.25. The Ge-percentage of layer 124 is in the range z=0.3 to 1.0, and preferably has a value where z-y is greater than 0.2. Next a thin gate oxide layer 127, is grown or deposited, followed by a p-type doped poly-silicon layer. The CMOS circuit can be fabricated by etching the poly-silicon to form the gates of the n- and p-type CMOS devices 128, which then act as implant masks for formation of p-type doped region 129, and n-type doped region 130. Doped regions 129 and 130 form contacts to the buried quantum well channel layers 124 and 122, respectively. Next, trench isolation regions 131, are formed and filled with dielectric material 132, for planarization. At this point, an etch is performed to expose the surface 8 of $Si_{1-y}Ge_y$ buffer layer 3, and a blanket insulating layer 134, such as silicon nitride, is deposited. Windows for forming the photodiode electrodes are patterned and etched at the same time as nitride sidewall regions 135 are formed. Finally, a salicide step is performed, as described in FIG. 11, to create the MSM electrodes 136, as well as the source and drain contacts 137 and 138 of the PMOS and NMOS devices, respectively. The embodiment shown in FIG. 13 is a versatile configuration where not only PMOS device 139 or NMOS device 140 can be combined with MSM photodetector 85 to act as part of a photoreceiver amplifier circuit, but PMOS device 139 and NMOS device 140 can be combined and used to form a CMOS logic circuit. Therefore, the embodiment in FIG. 13 can potentially be used to fabricate a high-speed photoreceiver circuit on the same chip as a high-speed, low-power CMOS technology, for future "system-on-a-chip" applications.

In the Figures, like references are used for functions corresponding to the apparatus of one or more earlier Figures.

While there has been described and illustrated a integrated optoelectronic receiver device containing a photodetector and MODFET having SiGe layers with one or more Si or SiGe layers under strain, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A semiconductor structure comprising a single crystal semiconductor substrate, a $Si_{1-x}Ge_x$ buffer layer graded from x=0 to y where y is in the range from 0.1 to 1.0, a layer of relaxed $Si_{1-y}Ge_y$ having a thickness ranging from 0.25 μm to 10 μm, a quantum well layer, an undoped $Si_{1-y}Ge_y$ spacer layer, and a doped $Si_{1-y}Ge_y$ supply layer, wherein said layer of relaxed $Si_{1-y}Ge_y$ functions as an absorbing region of a photodetector, said quantum well layer functions as a conducting channel of a field-effect transistor, and said spacer layer functions to separate dopants in said supply layer from said conducting channel.

2. The semiconductor structure of claim 1 further including spaced apart drain and source regions extending to said quantum well layer and a Schottky gate contact to control charge in said conducting channel to form a MODFET.

3. The semiconductor structure of claim 1 wherein portions of said quantum well layer, said undoped $Si_{1-y}Ge_y$ spacer layer and said doped $Si_{1-y}Ge_y$ supply layer are removed to provide an exposed portion of said relaxed $Si_{1-y}Ge_y$ layer, wherein electrodes are formed on said exposed portion of said relaxed $Si_{1-y}Ge_y$ layer to form a photodetector.

4. The semiconductor structure of claim 1 wherein said quantum well layer is under tensile strain.

5. The semiconductor structure of claim 1 wherein said quantum well layer consists of Si.

6. The semiconductor structure of claim 3 wherein said electrodes include two or more interdigitated Schottky electrodes.

7. The semiconductor structure of claim 1 wherein y is in the range from 0.2–0.35.

8. The semiconductor structure of claim 3 further including a trench extending through said exposed relaxed $Si_{1-y}Ge_y$ layer surface and surrounding said photodetector.

9. The semiconductor structure of claim 8 wherein said trench is filled with a dielectric material.

10. The semiconductor structure of claim 1 further including a layer of Si over said doped $Si_{1-y}Ge_y$ supply layer.

11. The semiconductor structure of claim 1 wherein said doped $Si_{1-y}Ge_y$ supply layer is n-type.

12. The semiconductor structure of claim 6 wherein positively-biased electrodes of said photodetector comprise Er, W, Ti, Ni or Co, and provide Schottky contacts with barrier height for holes that is greater than half the band gap of said exposed relaxed $Si_{1-y}Ge_y$ layer, and negatively-biased electrodes of said photodetector comprise Pt or Ir and provide Schottky contacts with barrier height for electrons that is greater than half the band gap of said exposed relaxed $Si_{1-y}Ge_y$ layer, wherein y ranges from 0.1 to 1.0.

13. The semiconductor structure of claim 6 wherein negatively-biased electrodes of said photodetector comprise Pt or Ir and provide Schottky contacts with barrier height for electrons that is greater than half the band gap of said exposed relaxed $Si_{1-y}Ge_y$ layer, and positively-biased electrodes of said photodetector comprise Er, W, Ti, Ni or Co, and form Ohmic contact to an n-type doped region, wherein y ranges from 0.1 to 1.0.

14. The semiconductor structure of claim 6 wherein negatively-biased electrodes of said photodetector form Ohmic contacts to a p-type doped region and said positively-biased electrodes of said photodetector form an Ohmic contact to an n-type doped region.

15. The semiconductor structure of claim 1 wherein said substrate is heavily-doped greater than $10^{18}$ atoms/cm$^3$.

16. The semiconductor structure of claim 1 wherein said substrate is an SOI substrate comprising a thick Si layer, a $SiO_2$ layer, and a Si overlayer.

17. The semiconductor structure of claim 3 wherein said substrate is lightly-doped Si, and the region of said substrate underneath said photodetector is heavily-doped greater than $10^{18}$ atoms/cm$^3$.

18. The semiconductor structure of claim 3 wherein said photodetector absorbing region is bordered by deep trenches extending from said photodetector surface down to said Si substrate, and filled with a dielectric material, so as to prevent photogenerated carriers generated in said $Si_{1-y}Ge_y$, buffer layer from diffusing laterally past said deep trenches.

19. The semiconductor structure of claim 1 further including spaced apart drain and source regions extending to said quantum well layer, a gate dielectric layer above said supply layer between said drain and source and a gate electrode above said gate dielectric layer to form a MOSFET.

20. The semiconductor structure of claim 1 further including first and second spaced apart doped regions, one above the other, with a portion of said relaxed $Si_{1-y}Ge_y$ layer there between to form a photodetector and an Ohmic contact to said respective first and second doped regions for applying a potential there between.

21. The semiconductor structure of claim 20 further including a trench extending into said exposed relaxed $Si_{1-y}Ge_y$ layer to provide a barrier to electrical charge.

22. The semiconductor structure of claim 20 wherein said first doped region includes a region of said quantum well layer, said undoped $Si_{1-y}Ge_y$ spacer layer and said doped $Si_{1-y}Ge_y$ supply layer.

23. The semiconductor structure of claim 20 wherein said second doped region includes a region of said substrate.

24. A semiconductor structure comprising a single crystal substrate, a $Si_{1-x}Ge_x$ buffer layer graded from x=0 to x=y, where y is in the range from 0.1 to 0.9, a constant composition layer of relaxed $Si_{1-y}Ge_y$ having a thickness ranging from 0.25 μm to 10 μm, a p-type doped $Si_{1-w}Ge_w$ supply layer, where w<y, an undoped $Si_{1-y}Ge_y$ spacer layer, a $Si_{1-x}Ge_x$ quantum well layer, where x>y, and an additional undoped $Si_{1-y}Ge_y$ spacer layer, wherein said constant composition layer of relaxed $Si_{1-y}Ge_y$ functions as an absorbing region of a photodetector, and said $Si_{1-z}Ge_z$ quantum well layer functions as a conducting channel of a field-effect transistor.

25. The semiconductor structure of claim 24 further including spaced apart drain and source regions extending to said quantum well layer and a Schottky gate contact to control charge in said conducting channel to form a MOD-FET.

26. The semiconductor structure of claim 25 wherein portions of said p-type doped $Si_{1-w}Ge_w$ supply layer, said undoped $Si_{1-y}Ge_y$ spacer layer, said $Si_{1-x}Ge_x$ quantum well layer, said additional undoped $Si_{1-y}Ge_y$ spacer layer are removed to expose said relaxed $Si_{1-y}Ge_y$ layer to form a photodetector.

27. A semiconductor structure comprising a single crystal semiconductor substrate, a $Si_{1-x}Ge_x$ buffer layer graded from x=0 to y in the range from 0.1 to 0.9, followed by a plurality of layers forming a symmetrically-strained superlattice and consisting of alternating layer, of $Si1-_wGe_w$ and $Si_{1-z}Ge_z$ where w<y<z, and having corresponding individual thicknesses such that the average Ge-composition of the layer is y, and having a total thickness ranging from 0.25 μm to 10 μm, and additionally a thin $Si_{1-y}Ge_y$ layer, a quantum well layer, an undoped $Si_{1-y}Ge_y$ spacer layer, and an n-type doped $Si_{1-y}Ge_y$ supply layer, wherein said symmetric superlattice functions as an absorbing region of a photodetector, and said quantum well layer functions as a conducting channel of a field-effect transistor.

28. The semiconductor structure of claim 27, wherein said transistor comprises trench or mesa-defined isolation regions, source and drain electrodes and a Schottky gate contact, and said photodetector includes two or more interdigitated Schottky electrodes deposited onto the etch-exposed surface of said thin $Si_{1-y}Ge_y$ layer.

29. A semiconductor structure comprising a substrate selected from the group consisting of Si and SOI, $Si_{1-x}Ge_x$ buffer layer graded from x=0 to x=y, where y is in the range from 0.1 to 1.0, a constant composition layer of relaxed $Si_{1-y}Ge_y$, of thickness 0.25 μm to 10 μm, a thin Si surface layer, and a thin gate dielectric, wherein said constant composition layer of relaxed $Si_{1-y}Ge_y$ acts as the absorbing region of a photodetector, and said Si surface layer acts as the conducting channel of field-effect transistor.

30. The semiconductor structure of claim 29, wherein said transistor comprises a trench or mesa-defined isolation regions, source and drain electrodes and a polysilicon or metal gate contact, and the photodetector consists of two or more Schottky electrodes formed on the surface of the top Si layer.

31. The semiconductor structure of claim 29, wherein said transistor source and drain contacts and the photodetector Schottky electrodes include one of metal-silicide and metal-germanosilicide.

32. A semiconductor structure comprising a single crystal semiconductor substrate, a $Si_{1-x}Ge_x$ buffer layer graded from x=0 to y where y is in the range from 0.1 to 0.9, a layer of relaxed $Si_{1-y}Ge_y$ having a thickness ranging from 0.25 μm to 10 μm, an n-type doped $Si_{1-y}Ge_y$ supply layer, a first undoped $Si_{1-y}Ge_y$, a first quantum well layer, a second undoped $Si_{1-y}Ge_y$ offset layer, a second quantum well layer, a third undoped $Si_{1-y}Ge_y$ offset layer, an undoped Si layer, a gate dielectric and a gate electrode layer wherein said layer of relaxed $Si_{1-y}Ge_y$ functions as an absorbing region of a photodetector, and said first quantum well layer acts as an electron channel for an n-MOSFET and said second quantum well layer acts as a hole channel for a p-MOSFET.

33. The semiconductor structure of claim 32 wherein said n-MOSFET comprises trench or mesa-defined isolation regions, spaced apart source and drain regions extending to said first quantum well layer and a first gate electrode to control charge in said first quantum well layer, and said p-MOSFET comprises trench or mesa-defined isolation regions, spaced apart source and drain regions extending to said second quantum well layer and a second gate electrode to control charge in said second quantum well layer.

34. The semiconductor structure of claim 33 wherein portions of said n-type doped $Si_{1-y}Ge_y$ supply layer, said first undoped $Si_{1-y}Ge_y$, said second undoped $Si_{1-y}Ge_y$ offset layer, said second quantum well layer, said third undoped $Si_{1-y}Ge_y$ offset layer, said undoped Si layer, said gate dielectric layer and said gate electrode layer are removed to expose said relaxed $Si_{1-y}Ge_y$ layer wherein electrodes are formed on said exposed relaxed $Si_{1-y}Ge_y$ layer to form a photodetector.

* * * * *